US011682592B2

(12) United States Patent
O'Neill et al.

(10) Patent No.: US 11,682,592 B2
(45) Date of Patent: Jun. 20, 2023

(54) METHOD AND SYSTEM FOR AUTOMATED CHECKING AND VALIDATION OF LIGHT EMITTING DIODES ON COMPUTER SYSTEMS

(71) Applicant: Dell Products L.P., Round Rock, TX (US)

(72) Inventors: Vincent O'Neill, Cork (IE); Alan Rothstein, Chasmonaim (IL); Igor Yanyutin, Kfar Yona (IL); Gregory Smalling, Holly Springs, NC (US); Michael Guitard, Holly Springs, NC (US); Mark Burns, Cork (IE)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/066,500

(22) Filed: Oct. 9, 2020

(65) Prior Publication Data
US 2022/0115273 A1   Apr. 14, 2022

(51) Int. Cl.
*H01L 21/66* (2006.01)
*G11B 33/10* (2006.01)

(52) U.S. Cl.
CPC ............. *H01L 22/12* (2013.01); *G11B 33/10* (2013.01); *H01L 22/34* (2013.01)

(58) Field of Classification Search
CPC ......... H01L 22/12; H01L 22/34; G11B 33/10; G11B 15/04; G11B 19/04; G11B 27/34; G11B 27/36; G01N 15/12; G01N 15/1227; G01N 15/1218; G01N 17/02; G01N 15/1245

See application file for complete search history.

(56) References Cited

U.S. PATENT DOCUMENTS

| 6,806,715 | B1 * | 10/2004 | Domadia | G01R 31/2635 |
| | | | | 702/117 |
| 2009/0243846 | A1 * | 10/2009 | Yuuki | G06F 11/326 |
| | | | | 340/540 |
| 2017/0019656 | A1 * | 1/2017 | Liu | H04N 13/296 |

* cited by examiner

*Primary Examiner* — Jermele M Hollington
*Assistant Examiner* — Suresh K Rajaputra
(74) *Attorney, Agent, or Firm* — Terrile, Cannatti & Chambers, LLP; Emmanuel A. Rivera

(57) ABSTRACT

A system, method, and computer-readable medium are disclosed automatic validation of light emitting diodes (LEDs) of disk drives in disk processor enclosures (DPEs) or disk array enclosures (DAEs) during the manufacturing and integration of computer systems. An automated test script is performed in support of the integration of the computer system that includes the LEDs and includes a validation and checking step for the LEDs. A determination is made if a camera is properly calibrated to identify the LEDs as part of the validating and checking step for the LEDs. A DPE or DAE that contains disk drive units that include the LEDs are identified, and an indication is performed as to which LEDs pass or fail.

20 Claims, 6 Drawing Sheets

METHOD AND SYSTEM FOR AUTOMATED CHECKING AND VALIDATION OF LIGHT EMITTING DIODES ON COMPUTER SYSTEMS

BACKGROUND OF THE INVENTION

Field of the Invention

The present invention relates to manufacturing of computer systems. More specifically, embodiments of the invention relate to automatic validation of light emitting diodes (LEDs) of disk drives in disk processor enclosures (DPEs) or disk array enclosures (DAEs) during the manufacturing and integration of computer systems.

Description of the Related Art

In manufacturing and integration of computer systems, such as server computers, workstations, laptop computers, etc., different parts and sub-systems, collectively referred to as components, are checked and validated to assure proper installation in the computer system. In particular, such validation is performed during a manufacturing test.

In certain instances, the manufacturing test can involve automated testing performed by a machine (i.e., computerized automatic tester) implementing an automated test script and various automated steps. The automated testing can take place without the need of manual intervention; however, in certain cases, such as when light emitting diodes (LEDs) of disk drives in disk processor enclosures (DPEs) or disk array enclosures (DAEs) are checked and validated, the automated test and test script are paused to allow a manual check or validation of the LEDs. Therefore, the automated test and test script are stopped and restarted to allow for such a manual check or validation.

The pause (i.e., stop/start) in the automated test script can increase the time to perform testing and reduce efficiency of the automated test. Manual intervention increases validation time. Furthermore, because a manual step is needed, human error and inconsistencies can arise.

SUMMARY OF THE INVENTION

A system, method, and computer-readable medium are disclosed automatic validation of light emitting diodes (LEDs) of disk drives in disk processor enclosures (DPEs) or disk array enclosures (DAEs) during the manufacturing and integration of computer systems. An automated test script is performed in support of the integration of the computer system that includes the LEDs and includes a validation and checking step for the LEDs. A determination is made if a camera is properly calibrated to identify the LEDs as part of the validating and checking step for the LEDs. A DPE or DAE that contains disk drive units that include the LEDs are identified, and an indication is performed as to which LEDs pass or fail.

BRIEF DESCRIPTION OF THE DRAWINGS

The use of the same reference number throughout the several figures designates a like or similar element. The present invention may be better understood, and its numerous objects, features, and advantages made apparent to those skilled in the art by referencing the accompanying drawings, wherein.

DETAILED DESCRIPTION

A system, method, and computer readable medium are disclosed for automatic checking and validation of light emitting diodes (LEDs) in support of the manufacturing and integrating of computer systems. In various implementations, such LEDs are part of disk drive units that are part of computer systems, such as server computers. In various embodiments, a camera identifies disk processor enclosures (DPEs) or disk array enclosures (DAEs) that hold multiple disk drive units. Multiple DPEs or DAEs can be placed in a trolley as the camera scans and identifies the DPEs or DAEs. LEDs on the disk drive units are further identified by the camera. In particular, the LEDs are identified as being on or off during automated testing performed on the disk drive units. Therefore, a pass or fail indication can be performed as to the LEDs in support of an automated test.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
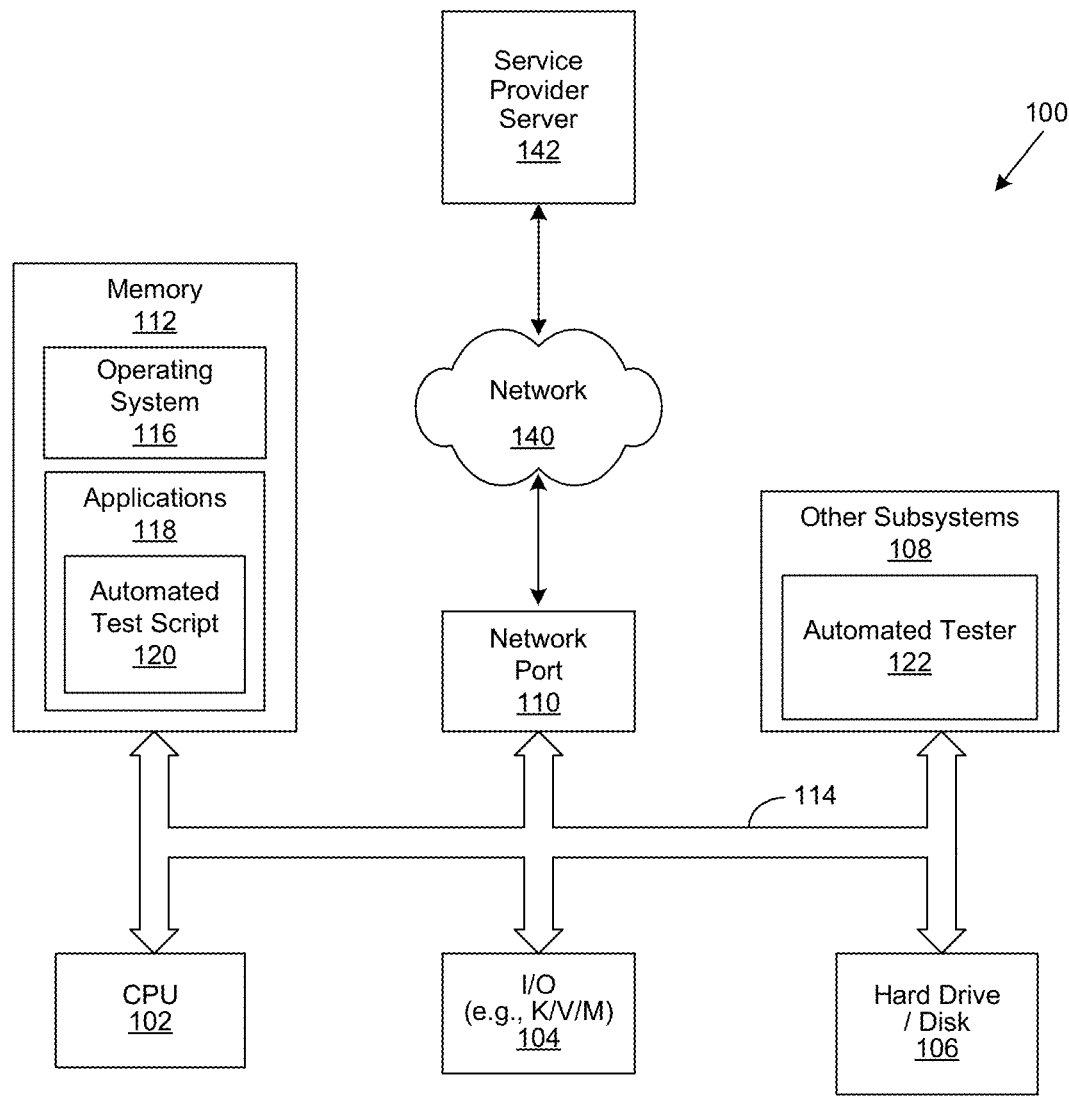
FIG. 1 depicts a general illustration of a computing system as implemented in the system and method of the present invention.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The network 140 may be a public network, such as the Internet, a physical private network, a wireless network, a virtual private network (VPN), or any combination thereof. Skilled practitioners of the art will recognize that many such embodiments are possible, and the foregoing is not intended to limit the spirit, scope, or intent of the invention.

The information handling system 100 likewise includes system memory 112, which is interconnected to the foregoing via one or more buses 114. System memory 112 further includes an operating system (OS) 116 and applications 118. In certain embodiments, applications 118 are provided as a service from the service provider server 142.

Certain embodiments provide for applications 118 to include an automated test script 120, and other subsystems 108 to include an automated tester 122. Automated test script 120 and automated tester are further described herein.

Figure 2:
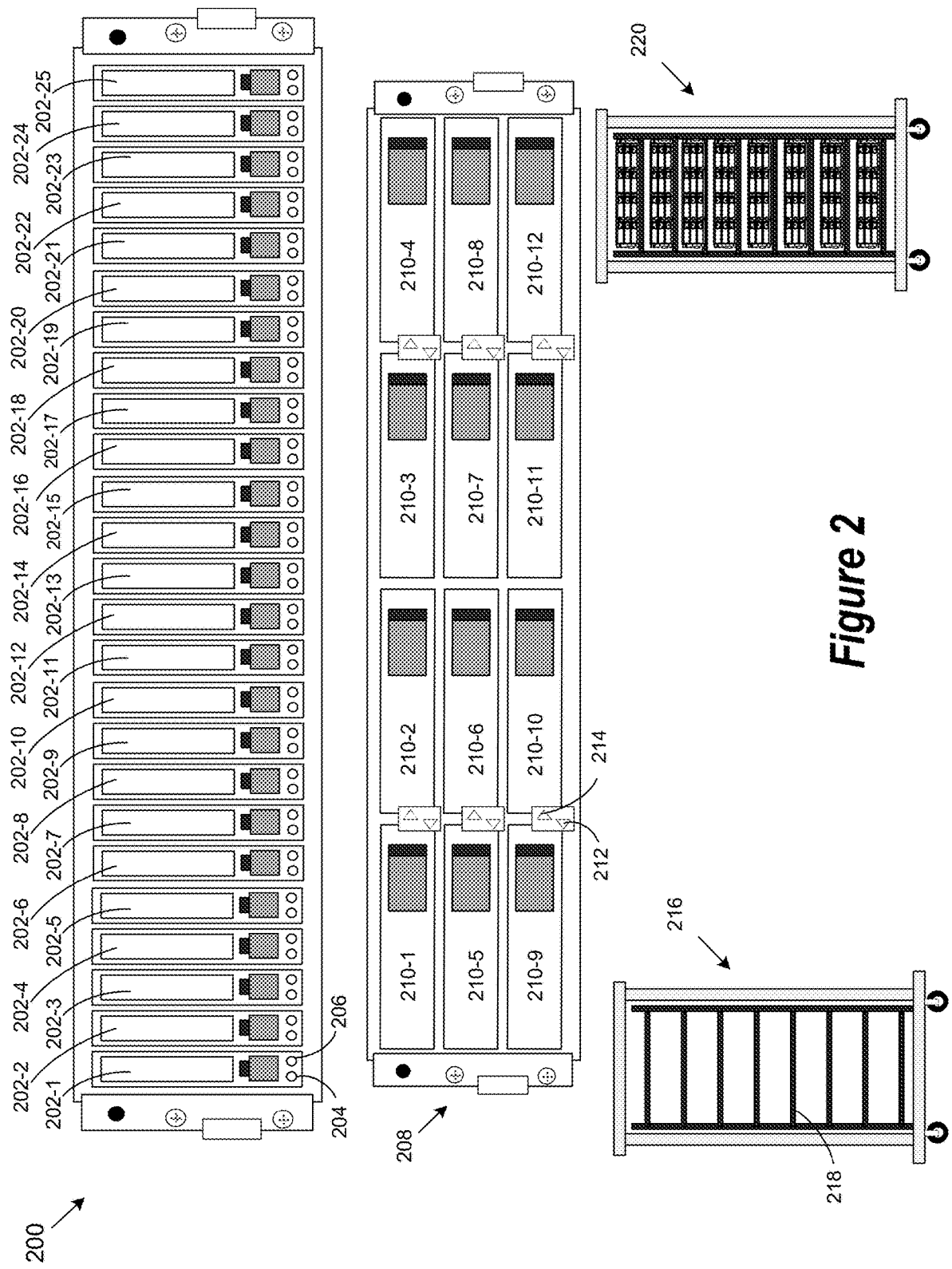
FIG. 2 depicts disk processor enclosures (DPEs) or disk array enclosures (DAEs), disk drive units, light emitting diodes (LEDs), and trolleys.

FIG. 2 shows disk processor enclosures (DPEs) or disk array enclosures (DAEs), disk drive units, light emitting diodes (LEDs), and trolleys. The LEDs of the disk drive units indicating power and fault status.

DPE or DAE 200 is an example of a 25 drive "2U" DPE or DAE (i.e., occupies "2U" of space in a storage cabinet), that holds 25 disk drive units 202-1 to 202-25. The disk drive units 202 can be 2.5" drives used in computer systems, such as server computers. In certain implementations, each disk drive unit 202 can include two LEDs. For example, one LED to indicate power status and another LED to indicate to fault status. LED 204 and LED 206 of disk drive unit 202-1 are examples of such LEDs that can be included in disk drive unit 202.

DPE or DAE 208 is an example of a 12 drive "2U" DPE or DAE (i.e., occupies "2U" of space in a storage cabinet), that holds 12 disk drive units 210-1 to 210-12. The disk drive unit 210 can be 3.5" drives used in computer systems, such as server computers. In certain implementations, each disk drive unit 210 can have a single LED to indicate both power status and fault status. For example, LED 212 provides power status and fault status to disk drive unit 210-9, and LED 214 provides power and fault status to disk drive unit 210-10.

In certain implementations, during automatic testing, multiple DPEs or DAEs 200 and/or 208 can be placed into a trolley 216, and particularly into a rack 218 in the trolley 216. Certain embodiments provide for the rack 218 to support eight DPEs or DAEs 200 and/or 208. A fully occupied trolley 220 is shown.

Figure 3:
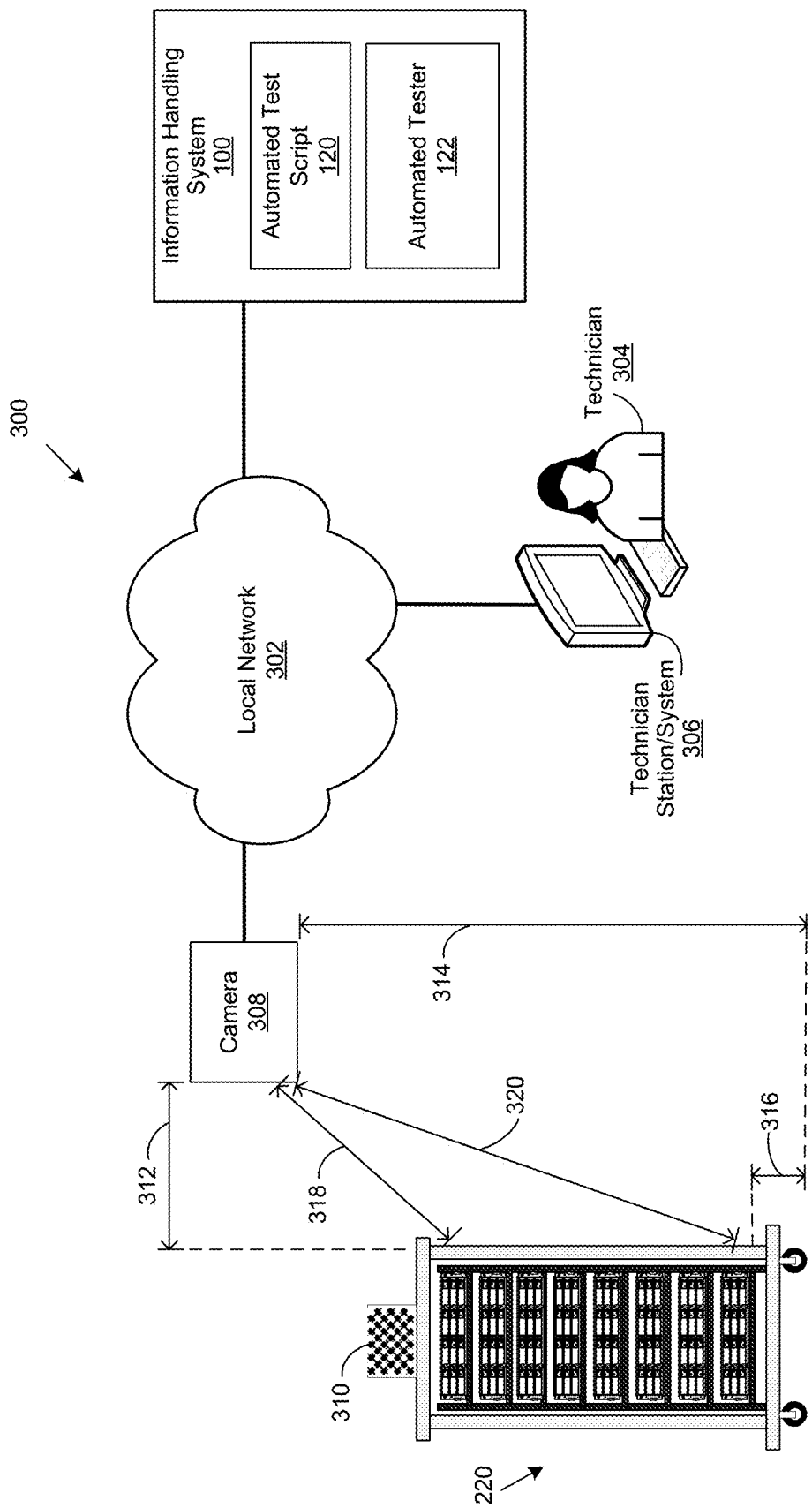
FIG. 3 depicts a system for automated testing of computer systems.

FIG. 3 is a simplified block diagram of a system for automated testing of computer systems. In particular, the system 300 supports automated validation and checking of LEDs of disk drive unit of computer systems. The system 300 includes the information handling system 100 which includes the automated test script 120 and the automated tester 122. In various embodiments, the automated teste 122 is configured to run the automated test script 120. In particular, in various implementations, the automated test script 120 runs manufacturing and integration of computer systems, such as server computers and can include various automated steps. One of the automated steps can include an automated step of checking and validating LEDs of disk drive units.

In certain implementations, the information handling system 100 connects with other devices and systems of the system 300 through a local network 302. It is also to be understood, that other implementations provide for direct connection of the information handling system 100 and other devices and systems of the system 300.

Certain implementations provide for a technician 304 through a technician station/system 306 to connect with the information handling system 100. In particular, the technician 304 can control or implement the use of the automated tester 122 and automated test script 120 during manufacturing and integration of computer systems.

The system 300 further includes a camera 308, which is configured to identify DPEs or DAEs and LEDs during the automated step of checking and validating LEDs of disk drive units. In certain implementations, the camera 308 is supports at least an 8 megapixel resolution. Camera 308 can be connected via various network connections, including local area network connections, and be powered by various methods.

The camera 308 can be oriented with a 180° field of view. Prior to performing automated step of checking and validating LEDs of disk drive units, camera 308 can be calibrated. Calibration includes focusing of the camera 308, either manually or through automatic/mechanical focusing. Camera 308 particularly calculates size and distortion of an object by determining the size of a nearby object. In certain implementations, a calibration is performed using a "chessboard", such as chessboard 310. An example dimension for chessboard 310 is 10×7 inches. The chessboard 310 can be printed out on A4 size piece of paper or cardboard. Various implementations provide for the chessboard 310 to be placed on a top cross bar of trolley 220.

In certain implementations, the camera 308 is placed above the trolley 220. For example, the camera 308 can be attached on an overhead gantry off a shop floor in a manufacturing environment. Considerations are made as to the location of the camera to properly identify LEDs of disk drive units. For example, distance from the camera 308 to the trolley 220 (or rack) considers the size of the LED. As an example, if checking is performed for 3 mm LEDs, implementation may be provided for a minimum distance of about 2.5 meters from an 8 megapixel resolution camera 308 to the furthest DPE or DAE on the trolley 220. An optimal calculated distance camera 308 and a full size trolley 218 can be 2 meters for a minimal LED size of 2 mm where the minimal distance between LEDs being 2 mm. Example distances are the following. Horizontal distance 312 from camera 304 to the front of trolley 220 can be approximately 1.6 meters. Vertical distance 314 from the camera 304 to the shop floor can be approximately 2.25 meters. Vertical distance 316 from the bottom of the lowest DPE or DAE on trolley 220 to the shop floor can be approximately 0.30 meters. Distance 318 from the top of the upper most DPE or DAE on trolley 218 to camera 308 can be approximately 1.7 meters. Distance 320 from the bottom of the lower most DPE or DAE on trolley 218 to camera 308 can be approximately 2.5 meters.

Figure 4:
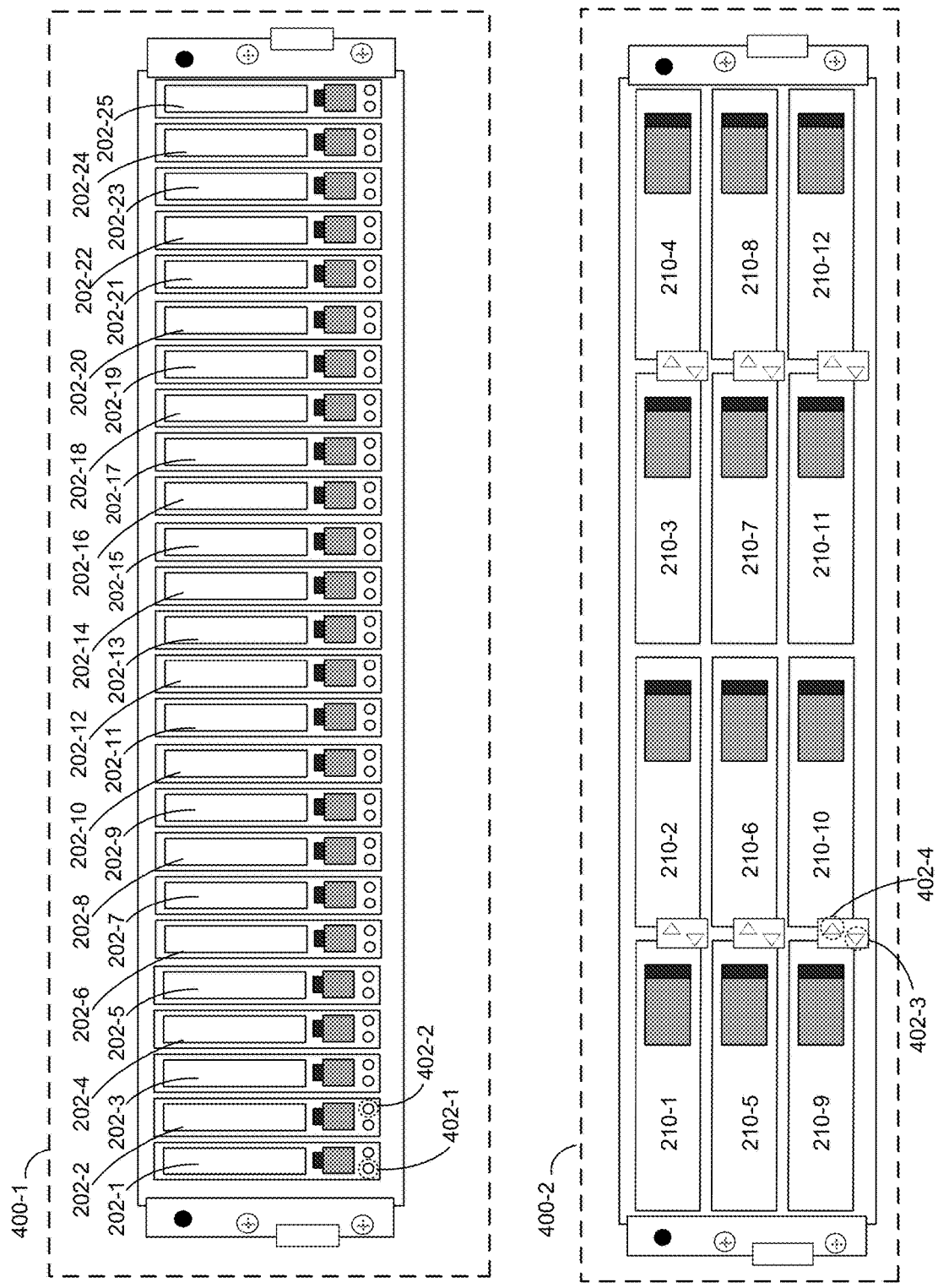
FIG. 4 depicts snapshots identifying DPEs or DAEs and LEDs.

FIG. 4 shows snapshots identifying DPEs or DAEs and LEDs. In certain implementations, the automated tester 122, and particularly during the automated step of checking and validating LEDs of disk drive units, identifies DPEs or DAEs and LEDs that are in a trolley 220.

Certain implementations provide for the camera 308 to take a "snapshot" of the DPEs or DAEs and LEDs of the trolley 220. The snapshot includes superimposing areas, such as rectangles or circles around identified DPEs or DAEs and LEDs. Certain implementations can provide for different colored superimposed areas (e.g., rectangles or circles).

In the example shown in FIG. 4, rectangles 400-1 and 400-2 identify DPEs or DAEs that are found a rack or trolley 220. For example, rectangles 400 may be distinguished as red colored rectangles. For example, circles 402-1, 402-2, 402-3 and 404-4 can identify LEDs. Particular colored LEDs can be identified by colored circles, such as blue circles 402 identifying blue LEDs and yellow circles identifying yellow LEDs. The color of an LED may be indicative of the function of the LED, such as power or fault status.

Various implementations provide for the snapshots with superimposed areas to be displayed to a technician 304 on a screen/display of the technician station/system 306.

Figure 5:
FIG. 5 depicts graphical user interfaces (GUIs) that are implemented when performing automated testing of computer systems.
Figure 5:
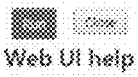
Figure 5:
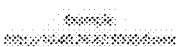
Figure 5:
Figure 5:

FIG. 5 shows example graphical user interfaces (GUIs) that can be implemented when performing automated testing of computer systems. In particular, the GUIs support automated validation and checking of LEDs of disk drive units of computer systems.

In certain implementations, an automated test can be initiated by a technician 304 through the technician station/system 306. There can be particular test slots which are assigned a unique IP address. In such instances, a web browser on the technician station/system 306 can be opened and the unique IP address entered as to a particular test slot. GUI 500 is an example of a startup or assist menu that can be presented to conduct automated validation and checking of LEDs of disk drive units. GUI 502 is an example of a GUI that can appear when a "run" command is initiated. In particular, the GUI shows status of a DPE or DAE and LEDs that can be identified from snapshots as described in FIG. 4.

Figure 6:
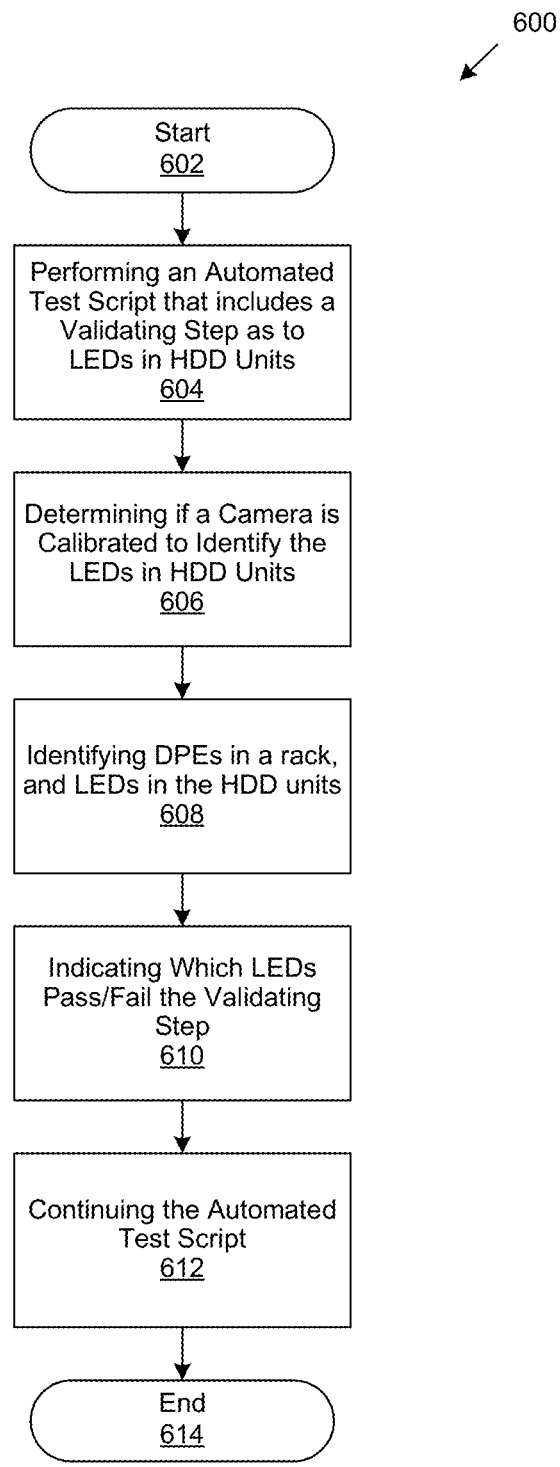
FIG. 6 shows a flow chart for automatic validation of light emitting diodes (LEDs) of disk drives during the manufacturing and integration of computer systems.

FIG. 6 is a generalized flowchart 600 for automatic validation of light emitting diodes (LEDs) of disk drives during the manufacturing and integration of computer systems. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At step 602, the process 600 starts. At step 604, an automated test script is performed, such as the described automatic test script 120 which can be part automated tester 122. The automated test script can be used to support the manufacturing and integration of computer systems. The automated test script includes a validating and checking step as to LEDs in disk drive units of the computer systems, where the disk drive units are placed in a rack and trolley during automated testing and the validation and checking. The automated testing can be initiated by a calling up a web browser and identifying a test slot for the automated test and initiating graphical user interfaces (GUI) as described.

At step 606, a determination is made if a camera is properly calibrated to identify LEDs in the disk drive units. As described the camera is calibrated per distance to the LEDs in the disk drive units which are placed in disk processor enclosures (DPEs) or disk array enclosures (DAEs), and the DPEs or DAEs are in a rack and/or trolley. Various metrics are considered, including size of LEDs and distance between LEDs. In addition, resolution of the camera can be considered. Calibration can be performed using a known and determined object, such as a "chessboard" as described above. The camera is focused as part of the calibration.

At step 608, the DPEs or DAEs, disk drive units and LEDs are identified as part of the validating and checking step of the LEDs. As described the identifying can be performed by taking a picture or snapshot by the camera and superimposing areas around the DPEs or DAEs and LEDs. The superimposed areas can be designated by particular colors as described. The identification can b include presenting the superimposed areas can be represented in chart of a GUI that shows the DPEs or DAEs and LEDs as shown in FIG. 4.

At step 610, indicating which LEDs pass or fail is performed as to the validating and checking step. At step 612, the automated test scrip continues to support manufacturing and integration of computer systems. At step 614, the process 600 ends.

As will be appreciated by one skilled in the art, the present invention can be embodied as a method, system, or computer program product. Accordingly, embodiments of the invention can be implemented entirely in hardware, entirely in software (including firmware, resident software, microcode, etc.) or in an embodiment combining software and hardware. These various embodiments can all generally be referred to herein as a "circuit," "module," or "system." Furthermore, the present invention can take the form of a computer program product on a computer-usable storage medium having computer-usable program code embodied in the medium.

Any suitable computer usable or computer readable medium can be utilized. The computer-usable or computer-readable medium can be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium can be any medium that can contain, store, communicate, or transport the program for use by or in connection with the instruction execution system, apparatus, or device.

Computer program code for carrying out operations of the present invention can be written in an object oriented programming language such as Java, Smalltalk, C++ or the like. However, the computer program code for carrying out operations of the present invention can also be written in conventional procedural programming languages, such as the "C" programming language or similar programming languages. The program code can execute entirely on the user's computer, partly on the user's computer, as a stand-alone software package, partly on the user's computer and partly on a remote computer or entirely on the remote computer or server. In the latter scenario, the remote computer can be connected to the user's computer through a local area network (LAN) or a wide area network (WAN), or the connection can be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions can also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A computer-implementable method for automated validation of light emitting diodes (LEDs) of disk drives units contained in disk processor enclosures (DPEs) or disk array enclosures (DAEs), comprising:
    performing an automated test script in support of the integration of a computer system that includes the LEDs of the disk drive units, wherein the automated test script includes a validation and checking step for the LEDs of the disk drive units;
    determining if a camera is properly calibrated to identify the LEDs of the disk drive units as part of the validating and checking step for the LEDs of the disk drive units, wherein calibration is performed by determining the size of an object based on a known distance from the camera, the object being an LED of the disk drive units of a minimal size, the camera placed at a minimum distance from the LED of the disk drive units based on the minimal size of the LED of the disk drive units;
    identifying the LEDs of the disk drive units and disk processor enclosures (DPEs) or disk array enclosures (DAEs) that contain disk drive units that include the LEDs, wherein the DPEs or DAEs are included in a rack or trolley comprising test slots that houses multiple DPEs or DAEs; and
    indicating which LEDs pass or fail the validating and checking step, wherein particular test slots are assigned unique IP addresses.

2. The method of claim 1, wherein the performing the automated test script is initiated by a web browser that identifies a particular test slot by an assigned unique IP address to the particular test slot.

3. The method of claim 1, wherein calibrating the camera considers one or more of the following metrics: size of the one or more of LEDs, distance between LEDs, distance of the LEDs from the camera, and/or resolution of the camera.

4. The method of claim 1, wherein the identifying includes superimposing areas of the DPEs or DAEs and LEDs onto a snapshot taken by the camera.

5. The method of claim 4, wherein the superimposed areas are designated by particular colors.

6. The method of claim 1 further comprising providing graphical user interfaces (GUIs) as to initiating the automated test script and status of the LEDs.

7. A system comprising:
    a processor;
    a data bus coupled to the processor; and
    a non-transitory, computer-readable storage medium embodying computer program code, the non-transitory, computer-readable storage medium being coupled to the data bus, the computer program code interacting with a plurality of computer operations for automated validation of light emitting diodes (LEDs) of disk drives units contained in disk processor enclosures (DPEs) or disk array enclosures (DAEs) and comprising instructions executable by the processor and configured for:
    performing an automated test script in support of the integration of a computer system that includes the LEDs of the disk drive units, wherein the automated test script includes a validation and checking step for the LEDs of the disk drive units;
    determining if a camera is properly calibrated to identify the LEDs of the disk drive units as part of the validating and checking step for the LEDs of the disk drive units, wherein calibration is performed by determining the size of an object based on a known distance from the camera, the object being an LED of the disk drive units of a minimal size, the camera placed at a minimum distance from the LED of the disk drive units based on the minimal size of the LED of the disk drive units;
    identifying the LEDs of the disk drive units and disk processor enclosures (DPEs) or disk array enclosures (DAEs) that contain disk drive units that include the LEDs, wherein the DPEs or DAEs are included in a rack or trolley comprising test slots that houses multiple DPEs or DAEs; and
    indicating which LEDs pass or fail the validating and checking step, wherein particular test slots are assigned unique IP addresses.

8. The system of claim 7, wherein the performing the automated test script is initiated by a web browser that identifies a particular test slot by an assigned unique IP address to the particular test slot.

9. The system of claim 7, wherein calibrating the camera considers one or more of the following metrics: size of the one or more of LEDs, distance between LEDs, distance of the LEDs from the camera, and/or resolution of the camera.

10. The system of claim 7, wherein the identifying includes superimposing areas of the DPEs or DAEs and LEDs onto a snapshot taken by the camera.

11. The system of claim 10, wherein the superimposed areas are designated by particular colors.

12. The system of claim 7 further comprising providing graphical user interfaces (GUIs) as to initiating the automated test script and status of the LEDs.

13. A non-transitory, computer-readable storage medium embodying computer program code for automated validation of light emitting diodes (LEDs) of disk drives units contained in disk processor enclosures (DPEs) or disk array enclosures (DAEs), the computer program code comprising computer executable instructions configured for:
- performing an automated test script in support of the integration of a computer system that includes the LEDs of the disk drive units, wherein the automated test script includes a validation and checking step for the LEDs of the disk drive units;
- determining if a camera is properly calibrated to identify the LEDs of the disk drive units as part of the validating and checking step for the LEDs of the disk drive units, wherein calibration is performed by determining the size of an object based on a known distance from the camera, the object being an LED of the disk drive units of a minimal size, the camera placed at a minimum distance from the LED of the disk drive units based on the minimal size of the LED of the disk drive units;
- identifying the LEDs of the disk drive units and disk processor enclosures (DPEs) or disk array enclosures (DAEs) that contain disk drive units that include the LEDs, wherein the DPEs or DAEs are included in a rack or trolley comprising test slots that houses multiple DPEs or DAEs; and
- indicating which LEDs pass or fail the validating and checking step, wherein particular test slots are assigned unique IP addresses.

14. The non-transitory, computer-readable storage medium of claim 13, wherein the performing the automated test script is initiated by a web browser that identifies a particular test slot by an assigned unique IP address to the particular test slot.

15. The non-transitory, computer-readable storage medium of claim 13 wherein calibrating the camera considers one or more of the following metrics: size of the one or more of LEDs, distance between LEDs, distance of the LEDs from the camera, and/or resolution of the camera.

16. The non-transitory, computer-readable storage medium of claim 13, wherein the identifying includes superimposing areas of the DPEs or DAEs and LEDs onto a snapshot taken by the camera.

17. The non-transitory, computer-readable storage medium of claim 13 further comprising providing graphical user interfaces (GUIs) as to initiating the automated test script and status of the LEDs.

18. The method of claim 1, wherein a chessboard is placed on top of rack or trolley and the camera is positioned above the rack or trolley to perform calibration of the camera based on distance to the chessboard.

19. The system of claim 7, wherein the chessboard is placed on top of rack or trolley and the camera is positioned above the rack or trolley to perform calibration of the camera based on distance to the chessboard.

20. The non-transitory, computer-readable storage medium of claim 13, wherein the chessboard is placed on top of rack or trolley and the camera is positioned above the rack or trolley to perform calibration of the camera based on distance to the chessboard.

* * * * *